United States Patent [19]
Ho et al.

[11] Patent Number: 5,949,717
[45] Date of Patent: Sep. 7, 1999

[54] METHOD TO IMPROVE FLASH EEPROM CELL WRITE/ERASE THRESHOLD VOLTAGE CLOSURE

[75] Inventors: Ming-Chou Ho, Taichung; Juang-ker Yeh; Jian-Hsing Lee, both of Hsin-Chu; Kuo-Reay Peng, Kaoushing, all of Taiwan

[73] Assignee: Taiwan Semiconductor Manufacturing Company, Ltd., Hsin-Chu, Taiwan

[21] Appl. No.: 08/928,217

[22] Filed: Sep. 12, 1997

[51] Int. Cl.$^6$ ..................................................... G11C 16/04
[52] U.S. Cl. ................................ 365/185.29; 365/185.01; 365/185.28; 365/185.26
[58] Field of Search ..................... 365/185.01, 185.29, 365/185.28, 185.26, 185.18, 185.33, 218; 375/23.3; 437/43

[56] References Cited

U.S. PATENT DOCUMENTS

| | | | |
|---|---|---|---|
| 5,008,721 | 4/1991 | Gill et al. ................................. | 375/23.5 |
| 5,153,684 | 10/1992 | Shoji et al. .............................. | 375/23.5 |
| 5,210,048 | 5/1993 | Shoji et al. ................................ | 437/43 |
| 5,231,602 | 7/1993 | Radjy et al. .............................. | 365/185 |
| 5,481,494 | 1/1996 | Tang et al. .......................... | 365/185.24 |
| 5,485,423 | 1/1996 | Tang et al. .............................. | 365/185 |
| 5,521,866 | 5/1996 | Akaogi ................................ | 365/185.29 |
| 5,838,618 | 11/1998 | Lee et al. ............................ | 365/185.29 |

Primary Examiner—David Nelms
Assistant Examiner—Thong Le
Attorney, Agent, or Firm—George O. Saile; Stephen B. Ackerman; Billy J. Knowles

[57] ABSTRACT

A method to erase data from a flash EEPROM cell while electrical charges trapped in the tunnel oxide of a flash EEPROM cell are eliminated to maintain proper separation of the programmed threshold voltage and the erased threshold voltage after extended programming and erasing cycles. The method to erase a flash EEPROM cell begins by first applying a first relatively high positive voltage pulse to the source of the flash EEPROM cell. Simultaneously a ground reference voltage is applied to the control gate and to the semiconductor substrate. At this same time the drain is floating. The flash EEPROM cell is then detrapped by floating the source and drain and applying a second relatively high positive voltage pulse to the semiconductor substrate. At the same time a relatively large negative voltage pulse is applied to the control gate.

24 Claims, 5 Drawing Sheets

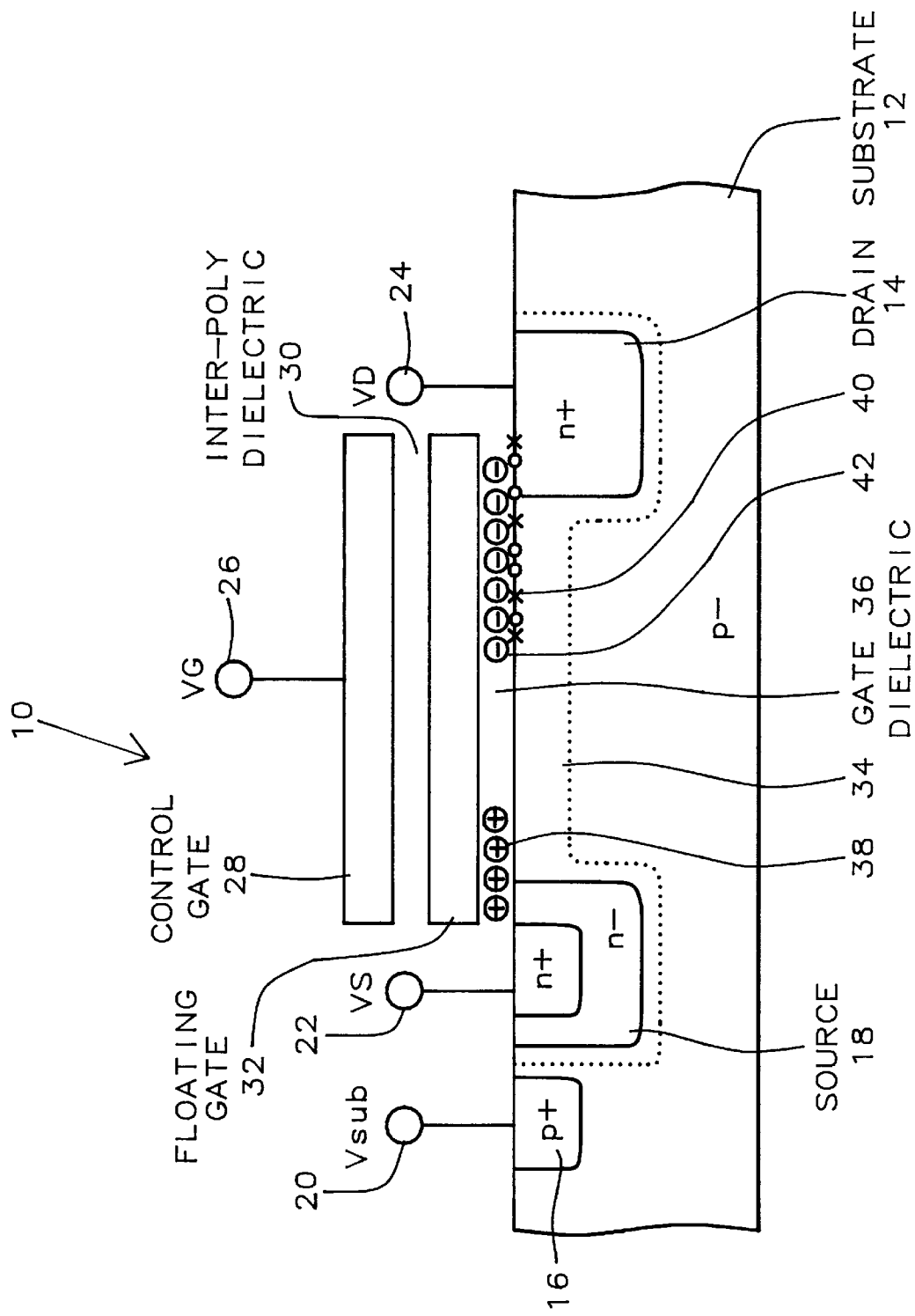
FIG. 1 – Prior Art

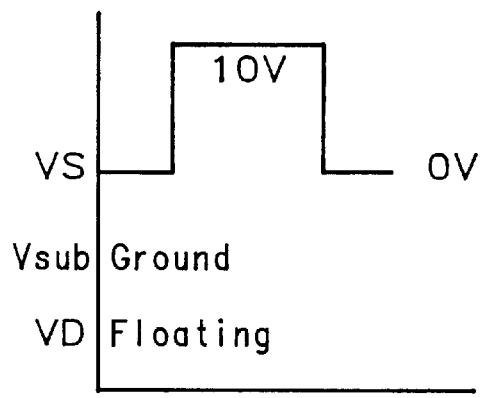
*FIG. 2 - Prior Art*
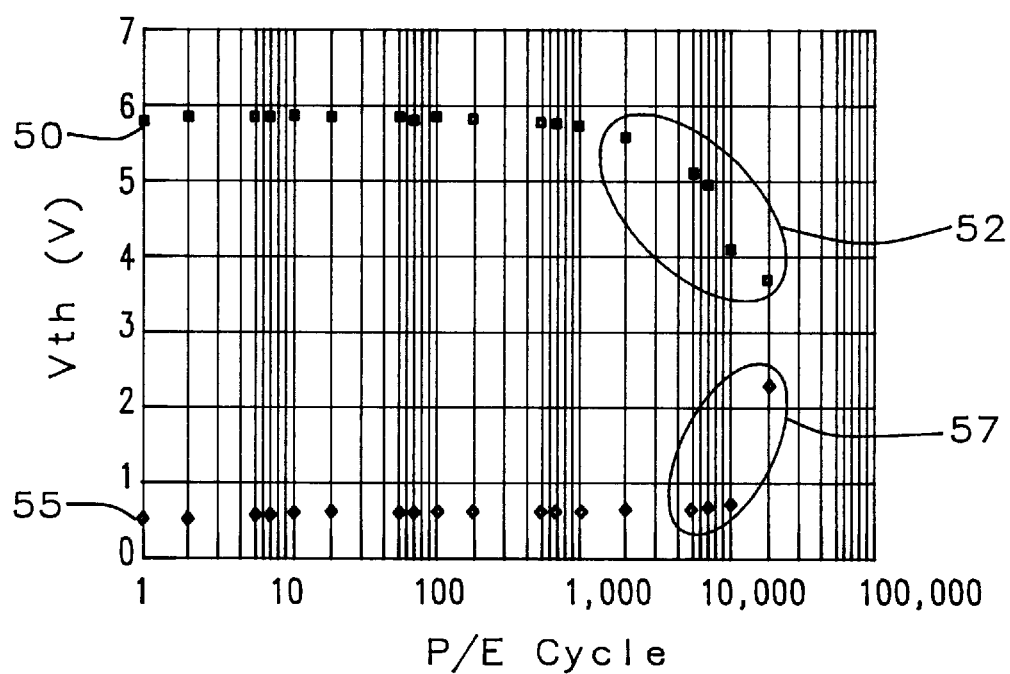
*FIG. 3 - Prior Art*

METHOD TO IMPROVE FLASH EEPROM CELL WRITE/ERASE THRESHOLD VOLTAGE CLOSURE

BACKGROUND OF THE INVENTION

RELATED PATENT APPLICATIONS

Attorney's Docket Number TSMC97-126, "A Novel Method to Erase A Flash EEPROM Using Negative Gate Source Erase Followed By A High Negative Gate Erase," Ser. No.: 08/928,227, Filing Date: Sep. 12, 1997, assigned to the Same Assignee as the present invention.

Attorney's Docket Number TSMC97-109, "A Mixed Mode Erase Method To Improve Flash EEPROM Write/Erase Threshold Closure," Ser. No.: 08/907,984, Filing Date: Aug. 11, 1997, assigned to the Same Assignee as the present invention.

Attorney's Docket Number TSMC97-085, "A Bi-Modal Erase Method For Eliminating Cycling-induced Flash EEPROM Cell Write/Erase Threshold Closure," Ser. No.: 081927,472, Filing Date: Sep. 11, 1997, assigned to the Same Assignee as the present invention.

Attorney's Docket Number TSMC97-099, "A Novel Erase Method Of Flash EEPROM By Using Snapback Characteristic," Ser. No.: 08/957,678, Filing Date: Oct. 24, 1997, assigned to the Same Assignee as the present invention.

1. Field of the Invention

This invention relates generally to a class of non-volatile memory devices referred to as flash electrically erasable programmable read-only memory (flash EEPROM). More particularly, this invention relates to methods and means to erase digital data from a flash EEPROM cell and for eliminating trapped charges from the flash EEPROM cell.

2. Description of Related Art

The structure and application of the flash EEPROM is well known in the art. The Flash EEPROM provides the density advantages of an erasable programmable read-only memory (EPROM) that employs ultraviolet light to eliminate the programming with the speed of a standard EEPROM. FIG. 1 illustrates a cross-sectional view of a flash EEPROM cell of the prior art. The flash EEPROM cell 10 is formed within a p-type substrate 12. An $n^+$ drain region 14 and an $n^+$ source region 18 is formed within the p-type substrate 12.

A relatively thin gate dielectric 36 is deposited on the surface of the p-type substrate 12. The thin gate dielectric 36 will also be referred to as a tunnel oxide, hereinafter. A poly-crystalline silicon floating gate 32 is formed on the surface of the gate dielectric 36 above the channel region 34 between the drain region 14 and source region 18. An interpoly dielectric layer 30 is placed on the floating gate 32 to separate the floating gate 32 from a second layer of poly-crystalline silicon that forms a control gate 28.

A $p^+$ diffusion 16 is placed in the p-type substrate 12 to provide a low resistance path from a terminal 20 to the p-type substrate. The terminal 20 will be attached to a substrate voltage generator Vsub. In most application of an EEPROM, the substrate voltage generator Vsub will be set to the ground reference potential (0V).

The source region 18 will be connected to a source voltage generator VS through the terminal 22. The control gate 28 will be connected through the terminal 26 to the control gate voltage generator VG. And the drain region 14 will be connected through the terminal 24 to the drain voltage generator VD.

According to conventional operation, the flash EEPROM cell 10 is programmed by setting the gate control voltage generator VG to a relatively high voltage (on the order of 10V). The drain voltage generator VD is set to a moderately high voltage (on the order of 5V), while the source voltage generator VS is set to the ground reference potential (0V).

With the voltages as described above, hot electrons will be produced in the channel 34 near the drain region 14. These hot electrons will have sufficient energy to be accelerated across the gate dielectric 36 and trapped on the floating gate 32. The trapped hot electrons will cause the threshold voltage of the field effect transistor (FET) that is formed by the flash EEPROM cell 10 to be increased by three to five volts. This change in threshold voltage by the trapped hot electrons causes the cell to be programmed.

During the programming process some of the hot electrons will be trapped 42 in the tunnel oxide 36 or in surface states 40 at the surface of the p-type substrate 12. These hot electrons will cause the reduction of the transconductance value and prvent channel hot electrons from injecting into the floating gate 32 during further programming steps. Therefore, the threshold voltage will decrease as cycling time increases.

To erase the flash EEPROM cell 10, as shown in FIG. 2, a positive voltage (on the order of 10V) is generated by the source voltage generator VS. The control gate voltage generator VG and the substrate voltage generator VS are set to the ground reference potential. The drain voltage generator VD is usually disconnected from the terminal 24 to allow the drain region 14 to float. Under these conditions there is a large electric field developed across the tunnel oxide 36 in the source 18 and floating gate 32 overlap region. This field causes the electrons trapped in the floating gate 32 to flow to portion of the floating gate 32 that overlaps the source region 18. The electrons are then extracted to the source region 18 by the Fowler-Nordheim tunneling.

During the erasure process, some positive charges 38 that result from band-to-band tunneling, will be forced and trapped in the tunnel oxide 36. These trapped positive charges will act as trapping centers which cause the erase threshold voltage to decrease when the holes are trapped the begining of the cycling and make the threshold voltage increase when electrons are trapped instead of the hole. As can be shown in FIG. 3, the combination of the decrease 52 in the programmed threshold voltage 50 and the increase 57 in the erased threshold voltage 55 will cause the separation of the programmed threshold voltage 50 and the erased threshold voltage 55 to close until the flash EEPROM cell 10 fails. At this time the flash EEPROM will no longer be able to operate reliably to store digital data.

U.S. Pat. No. 5,481,494 (Tang et al.) shows a method for tightening the threshold voltage $V_T$ distribution of an array of flash EEPROM cells. A relatively low positive voltage is applied to the source regions of the array of flash EEPROM cells and a negative voltage is applied to the control gate and lowered to a predetermined value during the erase cycle. This will insure a tighter distribution of the thresholds of the array of cells. The value of a load resistor between the low positive voltage and the source region is simultaneously reduced to a predetermined value so as to compensate for the increased erase time caused by the lowering of the magnitude of the negative constant voltage.

U.S. Pat. No. 5,485,423 (Tang et al.) describes a method of erasure of a flash EEPROM. A relatively low positive pulse voltage is applied to the source region of the flash EEPROM cell during the erase cycle. Simultaneously, a negative ramp voltage is applied to the control gate of the flash EEPROM. This will achieve an averaging of the tunneling field during the entire erase cycle.

U.S. Pat. No. 5,521,866 (Akaogi) describes a non volatile semiconductor memory device having a floating gate. The memory device is constructed with two wells diffused into the semiconductor substrate. The source and drain are then diffused into the second well with a floating gate and control gate disposed on the surface of the semiconductor substrate much as described in FIG. 1. The erasure process involves applying a positive voltage to each of the two wells.

U.S. Pat. No. 5,231,602 (Radjy et al.) describes a method of erasing a flash EEPROM cell by controlling the electric field across the tunnel oxide. The drain is connected through a variable resistor to a programming voltage source and a variable voltage source is connected to the source. The variable voltage source is adjusted between 0 and 5V, while the programming voltage source is set between 5V and 20V. The tunneling current is optimized by adjustment of the variable resistor and the variable voltage.

SUMMARY OF THE INVENTION

An object of this invention is to provide a method for the erasure of data from a flash EEPROM cell.

Another object of this invention is to provide a method to eliminate electrical charges trapped in the tunnel oxide and within surface states at the interface of the semiconductor substrate.

Further another object of this invention is to eliminate electrical charges trapped in the tunnel oxide of a flash EEPROM to maintain proper separation of the programmed threshold voltage and the erased threshold voltage after extended programming and erasing cycles.

To accomplish these and other objects a method to erase a flash EEPROM cell begins by erasing the flash EEPROM cell by first applying a first relatively high positive voltage pulse to the source of the EEPROM cell. Simultaneously a ground reference voltage is applied to the control gate and to the semiconductor substrate. At this same time the drain is floating. After completing the erasing, the flash EEPROM cell is then detrapped by floating the source and drain and applying a second relatively high positive voltage pulse to said semiconductor substrate. At the same time a relatively large negative voltage pulse is applied to the control gate.

BRIEF DESCRIPTION OF THE DRAWINGS

FIG. 1 is cross-sectional view of a flash EEPROM cell of the prior art.

FIG. 2 is timing diagram of an erase cycle of the flash EEPROM cell of the prior art.

FIG. 3 is a plot of the threshold voltages versus the number of programming and erasing cycles, using the erasing cycle of the prior art as shown in FIG. 2.

DETAILED DESCRIPTION OF THE INVENTION

Figure 4:
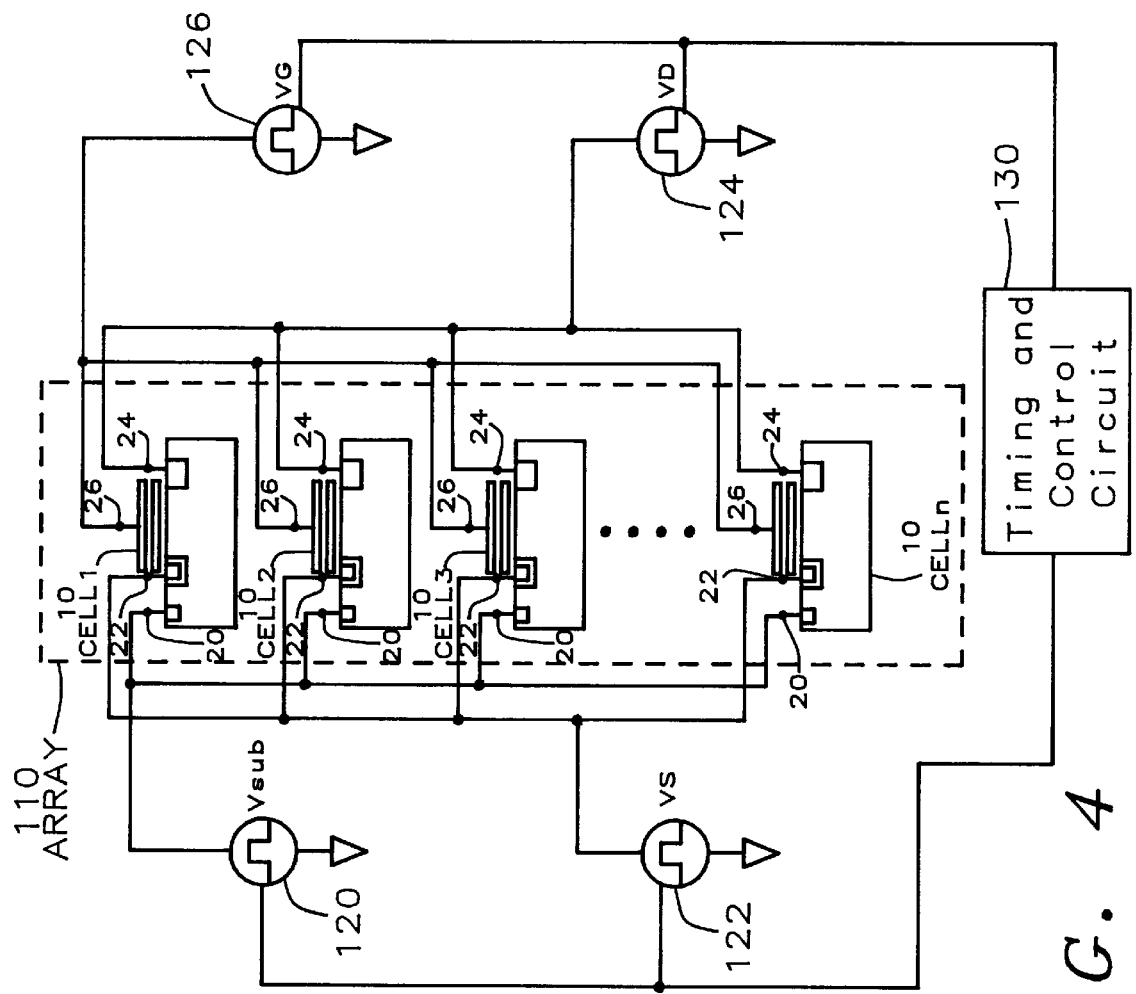
FIG. 4 is an array of flash EEPROM cells showing the connections of the voltage generators of this invention.

Referring now to FIG. 4, an array 110 of flash EEPROM cells 10 are disposed upon a common substrate. For convenience of design, the cells Cell1, Cell2, Cell3, ..., Celln will be formed into rows and column. The array will have auxiliary circuitry (not shown) that will address either the individual cells Cell1, Cell2, Cell3, ..., Celln or groups of cells for reading from the cells or for writing or programming the cells. The writing or programming procedures will as described for the flash EEPROM cell of FIG. 1.

The connection for the substrate voltage generator Vsub 120 will be connected through the terminal 20 to the p-type substrate. The connection of the source voltage generator VS 122 to the source region is through the terminal 22. The connection of the drain voltage generator VD 124 to the drain region is through terminal 24. And the connection of the gate control voltage generator VG 126 to the control gate is through the terminal 26. The timing and control circuitry 130 in conjunction with the auxiliary circuitry (not shown) will determine the voltages and timings for the substrate voltage generator Vsub 120, the source voltage generator VS 122, The drain voltage generator VD 124, and the gate control voltage generator VG 126.

Figure 5:
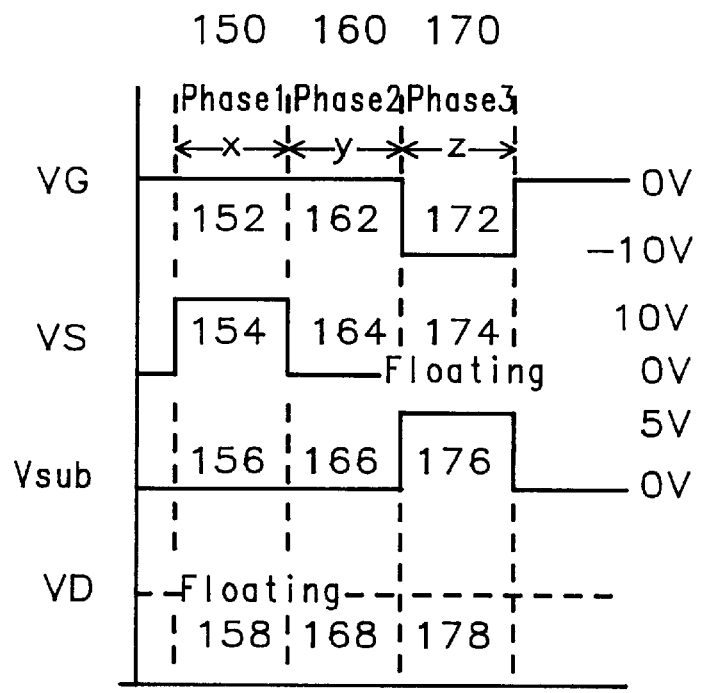
FIG. 5 is timing diagram of an erase cycle of a flash EEPROM of this is invention.

Refer now to FIGS. 1, 4, and 5 to understand the erase cycle of this invention. The initial period of the erase cycle (phase 1) or erasure phase 150 starts by setting the gate control voltage generator VG 126 and thus the control gate to the ground reference potential (0V) 152. The source voltage generator VS 122 and consequently the source region 18 will be set to a relatively high voltage (approximately 10V) 154. The substrate voltage generator Vsub 120 and thus the p-type substrate 12 will be set to the ground reference potential (0V) 156. The drain voltage generator VD 124 will be disconnected from the drain region 14 to be floating 158. The voltages as described will force the trapped charges on the floating gate 30 of the flash EEPROM cell 10 to migrate to the end of the floating gate 30 immediately above the source region 18. The electric field in the tunnel oxide 36 will force these trapped electrons to flow through the tunnel oxide 36 by the Fowler-Nordheim tunneling into the source region 18. At the completion of the phase 1 150 there will be positive charges 38 remaining in the tunnel oxide 36 as described above. Additionally there will be electrons 42 that have been trapped in the tunnel oxide 36 and at the surface states 40, again as described above.

A second phase (phase 2) 160 will terminate the erase cycle by bringing the source voltage generator VS 122 to the ground reference potential (0V). The gate control voltage generator VG 126 and the substrate voltage generator Vsub 120 will remain at the ground reference potential (0V) 162 and 166. The drain voltage generator VD 124 will remain disconnected from the drain region 24 to keep the drain region 24 floating 168.

Having terminated the erasure phase 150 in phase 2 160, the detrapping phase (phase 3) can begin. The gate control voltage generator VG 126 is brought to a relatively large negative voltage (−10V) 172. Concurrently, the source voltage generator VS 122 is disconnected from the source region 18 to allow the source region 18 to float 174. Also concurrently, the substrate voltage generator Vsub 120 and thus the p-type substrate 12 will be brought to a moderately large positive voltage (+5V) 176. At this time the drain voltage generator VD 124 will remain disconnected from the drain region 14 thus maintaining the drain region 14 at a floating condition 178.

The range of the source voltage generator VS 122 will be from 5.0V to 15V. The range of the gate control voltage generator VG 126 is from −5.0V to 15.0, and the range of the the substrate voltage generator Vsub 120 is from 0.5V to the value of the power supply voltage source or about 5.0V.

The relative period of time for the phase 1 150, of the erase cycle is 50 msec. in duration but can range from 10 msec. to 100 msec. Phase 2 160 and Phase 3 170 are approximately 30 and 50 msec. in duration respectively. The range in duration of phase 3 170 is from 10 msec. to 100 msec. Additionally the phase 3 170 would normally be practiced at every erase cycle. However, the phase 3 170 could be practiced periodically to eliminate trapped charges.

Figure 6:
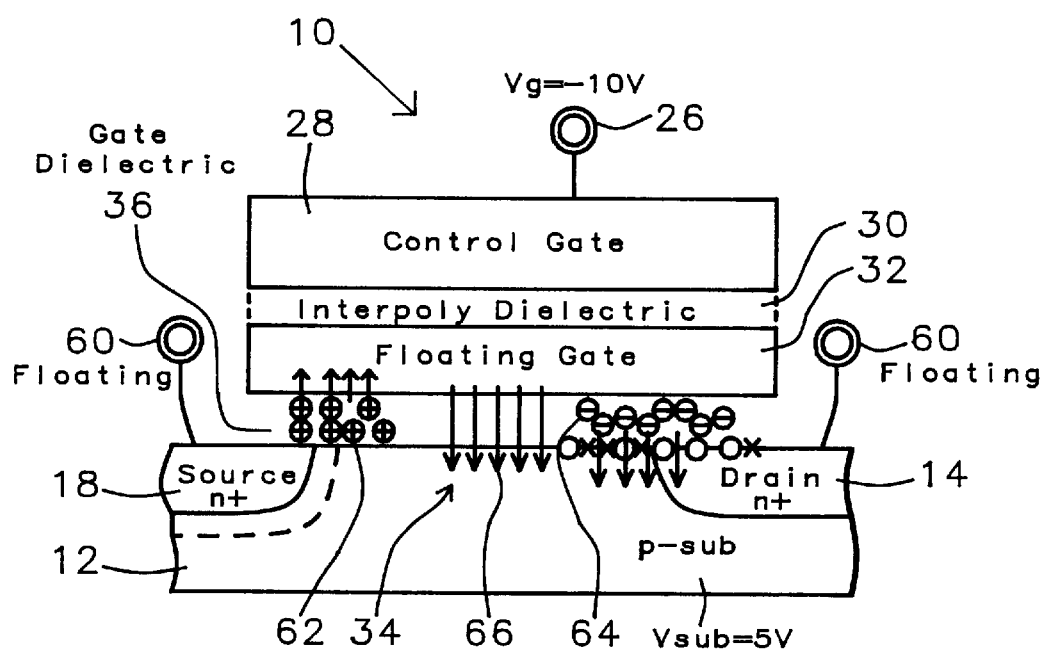
FIG. 6 is a cross-sectional view of a flash EEPROM illustrating the physical basis for the detrapping process of the erase cycle of this invention.

Refer now to FIG. 6 for a description of the physical basis for the detrapping phase of the erase cycle of the flash EEPROM of this invention. As above described, during the detrapping phase (phase 3), the gate control voltage generator VG is set to a relatively large negative voltage (-10V). Since the gate control voltage generator VG is connected through the terminal 26 to the control gate 28, the control gate 28 will be set to the relatively large negative voltage (-10V). The source region 18 and the drain 14 will be disconnected from their respective voltage generators and allowed to be floating 60. The voltage of the substrate voltage generator Vsub will be set to the moderately large positive voltage (5V) which will be connected through terminal 20 of FIG. 4 to the p-type substrate 12.

The voltage as described will set up an electric field 66 in the gate dielectric or tunnel oxide 36. Those electrons 64 trapped in the tunnel oxide 36 will be forced to be dissipated in the p-type substrate while the positive charges 62 will be attracted to the floating gate 32 thus eliminating any residual charges from the floating gate 32 or trapped charges from the tunnel oxide 36.

This process will insure that the erased threshold voltage for the flash EEPROM cell 10 will return to the low threshold voltage of a completely erased cell. The elimination of the trapped charges 64 will also allow the appropriate increase of the programmed threshold voltage to the high threshold voltage approximately (6V) of a programmed cell.

Figure 7:
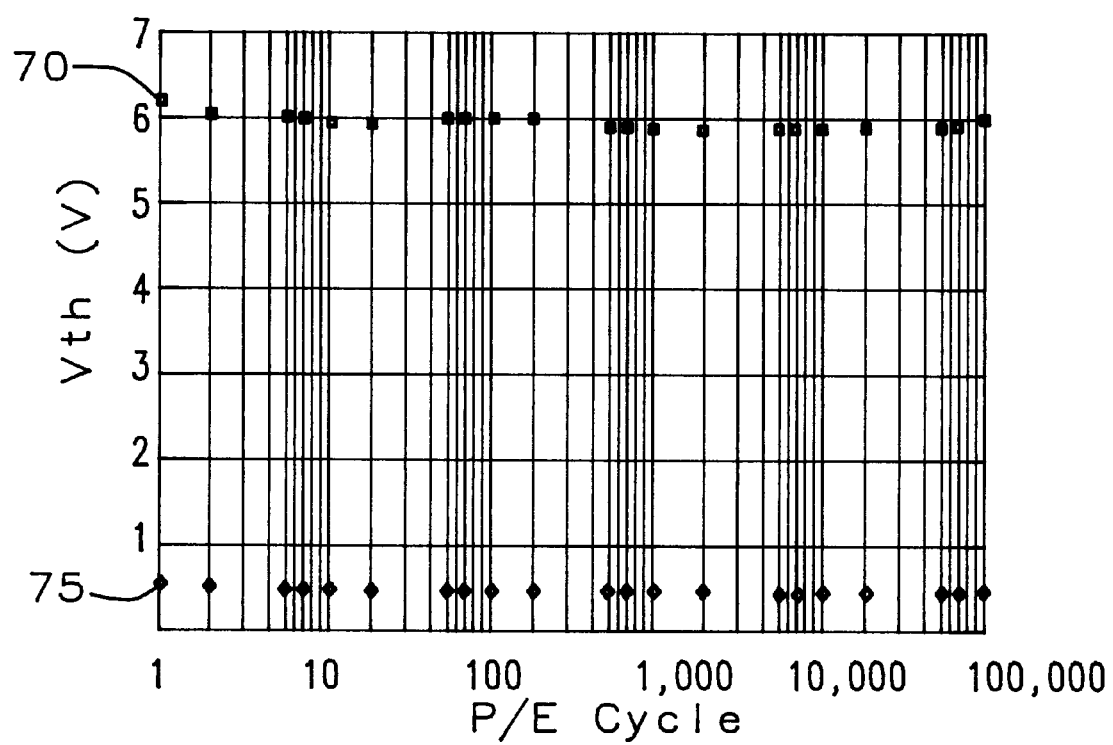
FIG. 7 is a plot of the threshold voltages versus the number of programming and erasing cycles using the erase cycle of this invention as shown in FIG. 5.

As is shown in FIG. 7, the programmed threshold voltage 70 will remain at a relatively constant value of approximately 6V for at least 100,000 program/erase cycles. Also, as can be seen, the erased threshold voltage 75 will remain at a constant value of approximately 0.5V for the 100,000 program/erase cycles. By not degrading the threshold as seen in FIG. 3, the flash EEPROM cell 10 of FIG. 4 and the flash EEPROM array 110 of FIG. 4 will maintain operation without failure for program/erase cycle in excess of 100,000 cycles.

While this invention has been particularly shown and described with reference to the preferred embodiments thereof, it will be understood by those skilled in the art that various changes in form and details may be made without departing from the spirit and scope of the invention.

What is claimed is:

1. A method to erase a flash EEPROM cell, which is comprised of a control gate, a floating gate, a source, a drain, and a tunnel oxide disposed upon a semiconductor substrate, to improve a write/erase threshold voltage closure from repeatedly writing and erasing said flash EEPROM cell, comprising the steps of:
   a) erasing said flash EEPROM cell by the steps of,
      applying a first relatively high positive voltage pulse to the source of said EEPROM cell,
      simultaneously applying a ground reference voltage to the control gate and to the semiconductor substrate,
      simultaneously floating said drain; and then
   b) detrapping said flash EEPROM cell by the steps of:
      floating said source and drain,
      applying a second relatively high positive voltage pulse to said semiconductor substrate,
      simultaneously applying a relatively large negative voltage pulse to said control gate.

2. The method to erase a flash EEPROM cell of claim 1 wherein erasing the flash EEPROM removes charges from the floating gate.

3. The method to erase a flash EEPROM cell of claim 1 wherein detrapping the flash EEPROM removes charges trapped in the tunnel oxide between the floating gate and the semiconductor substrate.

4. The method to erase a flash EEPROM cell of claim 3 wherein detrapping the flash EEPROM allows a separation of a programmed threshold voltage from an erased threshold voltage to be maintained over the repeated writing and erasing of said flash EEPROM, thus improving said write/erase threshold voltage closure.

5. The method to erase a flash EEPROM cell of claim 1 wherein the first relatively high voltage pulse has a voltage of from approximately 5.0V to approximately 10.0V.

6. The method to erase a flash EEPROM cell of claim 1 wherein the second relatively high voltage pulse has a voltage of from approximately 0.5V to approximately 5.0V.

7. The method to erase a flash EEPROM cell of claim 1 wherein the relatively large negative voltage pulse has a voltage of from approximately -5.0V to approximately -15.0V.

8. The method to erase a flash EEPROM cell of claim 1 wherein the first relatively high voltage pulse, the second relatively high voltage pulse, and the relatively large negative voltage pulse each have a duration of from approximately 10 m seconds to approximately 100 m seconds.

9. A non-volatile semiconductor memory device comprising:
   a) a semiconductor substrate of a first conductivity type;
   b) a pair of diffusions of a second conductivity type spaced distally from one another to form a source region and a drain region within said semiconductor substrate;
   c) a tunnel oxide insulation disposed upon said semiconductor substrate in a region generally between the source region and drain region in correspondence with a channel region and having a thickness which allows tunneling of carriers there through;
   d) a floating gate electrode disposed upon said tunnel oxide insulation generally in correspondence with said channel region;
   e) an inter-poly dielectric insulation disposed upon said floating gate electrode to insulate said floating gate;
   f) a control gate electrode disposed upon said inter-poly dielectric insulation generally aligned with said floating gate; and
   g) an erasing means to remove electrical charges from said floating gate electrode and to detrap trapped electrical charges from said tunnel oxide insulation to improve a separation factor of a programmed threshold voltage and an erased threshold voltage of said non-volatile semiconductor memory device wherein charges are removed from the floating gate by the steps of:
      coupling a first relatively high positive voltage source to apply first relatively high positive voltage source pulse to the source of said EEPROM cell,
      simultaneously coupling a ground reference voltage source to the control gate and to the semiconductor substrate, and simultaneously floating said drain, and wherein said trapped electrical charges are detrapped by the steps of:
  floating said source and drain,
  coupling a second relatively high positive voltage source to apply a second relatively high positive voltage pulse to said semiconductor substrate,
  simultaneously coupling a relatively large negative voltage source to apply a relatively large negative voltage pulse to said control gate.

10. The non-volatile semiconductor memory device of claim 9 wherein the first relatively high voltage pulse has a voltage of from approximately 5.0V to approximately 10.0V.

11. The non-volatile semiconductor memory device of claim 9 wherein the second relatively high voltage pulse has a voltage of from approximately 0.5V to approximately 5.0V.

12. The non-volatile semiconductor memory device of claim 9 wherein the relatively large negative voltage pulse has a voltage of from approximately −5.0V to approximately −15.0V.

13. The non-volatile semiconductor memory device of claim 9 wherein the first relatively high voltage pulse, the second relatively high voltage pulse, and the relatively large negative voltage pulse each have a duration of from approximately 10 m seconds to approximately 100 m seconds.

14. A non-volatile semiconductor memory device comprising:
  a) a semiconductor substrate of a first conductivity type;
  b) a plurality of memory cells arranged in an array wherein each cell comprises:
    a pair of diffusions of a second conductivity type spaced distally from one another to form a source region and a drain region within said semiconductor substrate.
    a tunnel oxide insulation disposed upon said semiconductor substrate in a region generally between the source region and drain region in correspondence with a channel region and having a thickness which allows tunneling of carriers there through,
    a floating gate electrode disposed upon said tunnel oxide insulation generally in correspondence with said channel region,
    an inter-poly dielectric insulation disposed upon said floating gate electrode to insulate said floating gate, and
    a control gate electrode disposed upon said inter-poly dielectric insulation generally aligned with said floating gate; and
  c) an erasing means to remove electrical charges from said floating gate electrode and to detrap trapped electrical charges from said tunnel oxide insulation to improve a separation factor of a programmed threshold voltage and an erased threshold voltage of said non-volatile semiconductor memory device wherein charges are removed from the floating gate by the steps of:
    coupling a first relatively high positive voltage source to apply first relatively high positive voltage source pulse to the source of said EEPROM cell,
    simultaneously coupling a ground reference voltage source to the control gate and to the semiconductor substrate, and
    simultaneously floating said drain,
  and wherein said trapped electrical charges are detrapped by the steps of:
    floating said source and drain,
    coupling a second relatively high positive voltage source to applying a second relatively high positive voltage pulse to said semiconductor substrate, and
    simultaneously coupling a relatively large negative voltage source to apply a relatively large negative voltage pulse to said control gate.

15. The non-volatile semiconductor memory device of claim 14 wherein the first relatively high voltage pulse has a voltage of from approximately 5.0V to approximately 1.0V.

16. The non-volatile semiconductor memory device of claim 14 wherein the second relatively high voltage pulse has a voltage of from approximately 0.5V to approximately 5.0V.

17. The non-volatile semiconductor memory device of claim 14 wherein the relatively large negative voltage pulse has a voltage of from approximately −5.0V to approximately −15.0V.

18. The non-volatile semiconductor memory device of claim 14 wherein the first relatively high voltage pulse, the second relatively high voltage pulse, and the relatively large negative voltage pulse each have a duration of from approximately 10 m seconds to approximately 100 m seconds.

19. An erasing means to remove charges and to detrap charges from flash EEPROM cells, wherein a flash EEPROM cell comprises a drain region, a source region, a floating gate, a control gate, a tunnel oxide, and an inter-poly dielectric disposed upon a semiconductor substrate, comprising:
  a) a first source coupled to the control gate;
  b) a second voltage source coupled to the source region;
  c) a third voltage source coupled to the drain region;
  d) a fourth voltage source coupled to the semiconductor substrate; and
  e) an erasing control means coupled to the first, second, third, and fourth voltage sources to control said first, second, third, and fourth voltage sources wherein said erasing is accomplished by:
    forcing said second voltage source to apply first relatively large high positive voltage pulse to the source of said EEPROM cell,
    simultaneously forcing the first and fourth voltage sources to a ground reference voltage, and
    simultaneously forcing the third voltage source to a floating condition,
  and wherein said trapped electrical charges are detrapped by the steps of:
    forcing said third and fourth voltage source to a floating condition,
    simultaneously forcing said fourth voltage source to apply a second relatively high positive voltage pulse to said semiconductor substrate, and
    simultaneously forcing said first voltage source to apply a relatively large negative voltage pulse to said control gate.

20. The erasing means of claim 19 wherein detrapping the flash EEPROM allows a separation of a programmed threshold voltage from an erased threshold voltage to be maintained over the repeated writing and erasing of said flash EEPROM, thus improving said write/erase threshold voltage closure.

21. The erasing means of claim 19 wherein the first relatively high voltage pulse has a voltage of from approximately 5.0V to approximately 10.0V.

22. The erasing means of claim 19 wherein the second relatively high voltage pulse has a voltage of from approximately 0.5V to approximately 5.0V.

23. The erasing means of claim 19 wherein the relatively large negative voltage pulse has a voltage of from approximately −5.0V to approximately −15.0V.

24. The erasing means of claim 19 wherein the first relatively high voltage pulse, the second relatively high voltage pulse, and the relatively large negative voltage pulse each have a duration of from approximately 10 m seconds to 100 m seconds.

* * * * *